United States Patent [19]
Voith et al.

[11] Patent Number: 5,636,224
[45] Date of Patent: Jun. 3, 1997

[54] METHOD AND APPARATUS FOR INTERLEAVE/DE-INTERLEAVE ADDRESSING IN DATA COMMUNICATION CIRCUITS

[75] Inventors: Raymond P. Voith; Sujit Sudhaman, both of Austin, Tex.

[73] Assignee: Motorola Inc., Schaumburg, Ill.

[21] Appl. No.: 430,668

[22] Filed: Apr. 28, 1995

[51] Int. Cl.$^6$ .................................................. G06F 11/00
[52] U.S. Cl. ...................... 371/2.1; 395/421.09; 395/484; 395/481
[58] Field of Search .................. 371/2.1, 2.2, 37.4, 371/37.5, 37.6, 40.1, 40.3, 39.1, 38.1; 360/48, 40, 49; 395/421.09, 410, 405, 484, 481

[56] References Cited

U.S. PATENT DOCUMENTS 4,363,125  12/1982  Brewer et al. ........................ 371/71
4,631,660  12/1986  Woffinden et al. .................... 364/200

OTHER PUBLICATIONS

Ramsey, John L.; "Realization of Optimum Interleavers"; IEEE Transactions on Information Theory, Vol. IT–16, No. 3, pp. 338–345; (May 1970).
Tong, P. T. et al.; "Revised FEC and Interleaving Recommendations for DMT ADSL"; pp. 1–6; (May 10, 1993).

*Primary Examiner*—Robert W. Beausoliel, Jr.
*Assistant Examiner*—Phung My Chung

[57]  ABSTRACT

Interleaving/de-interleaving of data is achieved by storing and subsequently retrieving portions of the data from circular buffers (60,70). The circular buffers (60,70) are addressed such that each circular buffer corresponds to an index of data ($B_i$). Thus, data (80) is written into a circular buffer (60,70) using a first modulo scheme and read using a second modulo scheme, where the second modulo scheme is based on the interleaving scheme. An index array (20) is used to point to the appropriate entry in the circular buffers (60,70) to ensure a proper interleave/de-interleave process.

18 Claims, 9 Drawing Sheets

INTERLEAVER AND DE-INTERLEAVER(N=7, D=3)

| | CODEWORD 640 | CODEWORD 641 | CODEWORD 642 | CODEWORD 643 |
|---|---|---|---|---|
| ORIG: 610 | A0 A1 A2 A3 A4 A5 A6 | B0 B1 B2 B3 B4 B5 B6 | C0 C1 C2 C3 C4 C5 C6 | D0 D1 D2 D3 D4 D5 D6 |
| INT: 620 | A0 Y5 Z3 A1 Y6 Z4 A2 | B0 Z5 A3 B1 Z6 A4 B2 | C0 A5 B3 C1 A6 B4 C2 | D0 B5 C3 D1 B6 C4 D2 |
| DEI: 630 | Y2 Y3 Y4 Y5 Y6 Z0 Z1 | Z2 Z3 Z4 Z5 Z6 A0 A1 | A2 A3 A4 A5 A6 B0 B1 | B2 B3 B4 B5 B6 C0 C1 |

METHOD AND APPARATUS FOR INTERLEAVE/DE-INTERLEAVE ADDRESSING IN DATA COMMUNICATION CIRCUITS

FIELD OF THE INVENTION

This invention relates generally to communication circuits and in particular to a method and apparatus for interleave/de-interleave addressing in data communication circuits.

BACKGROUND OF THE INVENTION

In data communications systems such as Asymmetric Digital Subscriber Lines (ADSL), noisy transmission lines can cause data to be corrupted or lost. In order to correct errors and recover lost data, additional error-checking data is often transmitted along with the transmitted data (payload data). The combination of a group of payload data bytes and the error-checking data for the group of payload data bytes is referred to as a codeword, or frame. The receiving end of the data transmission can determine if errors have occurred in a particular codeword based on the payload data and error-checking data received. If the amount of error or loss in a codeword is relatively small, the error-checking data can be used to recover the correct payload data.

Bursts of noise on the transmission media may cause the severity of data corruption in a codeword to be such that recovery is not possible. In order to reduce the impact of these bursts of noise, data interleaving techniques can be employed. By interleaving data from different codewords before transmission and de-interleaving the received data at the receiver, the impact of a burst of noise is spread over a number of different codewords, thus reducing the loss in each codeword to a level where recovery of the payload data in each codeword is possible.

The pattern of interleaving is controlled by two parameters. The first is the number of bytes of data in each codeword, which is represented by the number N. The second is the depth of interleaving to be performed, which is represented by the number D. Convolutional interleaving in ADSL requires that each of the N bytes $B_0, B_1, \ldots, B_{N-1}$ in a codeword be delayed by an amount that varies linearly with the byte index. Byte $B_i$ (the byte of the codeword with index i) is delayed by $(D-1)^* i$ bytes, where D is the interleave depth.

In order to interleave a data stream, memory is required to store the data from multiple codewords before transmission. If a particular byte is to be delayed by 20 bytes, the particular byte must be stored in memory for the next 20 transmissions before its turn to be transmitted arises. In one prior art technique described in the ADSL standard data is stored in memory in interleaved form and transmitted when completed interleaved codewords become available. The amount of memory required to perform the interleave function is equal to N*D bytes. It can be seen that as the number of bytes in a codeword and/or the depth of interleaving increases, the amount of memory required to store the interleaved data increases dramatically. Note that an equivalent amount of memory is required in the de-interleaver of the receiver, as data for different codewords will have to be stored until each de-interleaved codeword is complete.

The ANSI T1E1.4 (ADSL) committee has determined the parameters in an ADSL system regarding the size of each codeword (N) and the depth of interleaving (D). In a particular ADSL example, the size of each codeword (N) may be equal to 255 bytes, and the depth of interleaving (D) equal to 64. Thus, using prior art techniques, 255*64, or approximately 16K bytes of memory is required to interleave or de-interleave data. In integrated circuit (IC) implementations of data communications transmitters and receivers, these large memory blocks require a relatively large amount of die area, which increases the die size of the IC and the cost of the data communications system.

Therefore, in order to reduce die area and cost, a need exists for a method and apparatus to reduce the amount of memory required to perform interleave/de-interleaving of data in data communication systems.

BRIEF DESCRIPTION OF THE DRAWINGS

FIG. 1 illustrates an example data stream, interleaved data stream, and de-interleaved data stream;

DETAILED DESCRIPTION OF THE DRAWINGS

Figure 2:
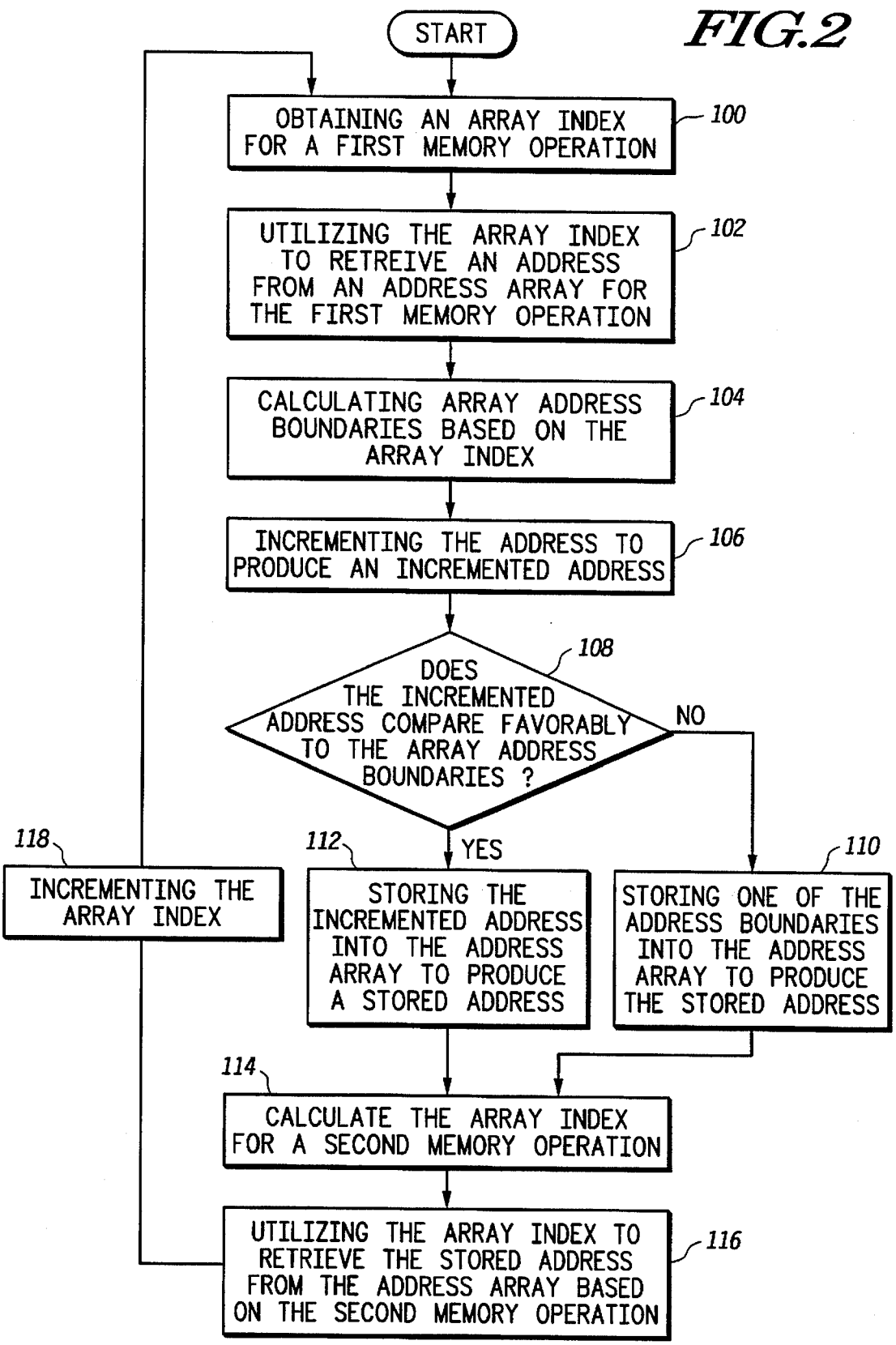
FIG. 2 illustrates, in a flow diagram, a method for interleave/de-interleave addressing in accordance with the present invention.

Generally, the present invention provides a method and apparatus for interleave/de-interleave addressing in data communication circuits. This is accomplished by storing and subsequently retrieving portions of the data from circular buffers. The circular buffers are addressed such that each circular buffer corresponds to an index of data ($B_i$). Thus, data is written into a circular buffer using a first modulo scheme and read using a second modulo scheme, where the second modulo scheme is based on the interleaving scheme. An index array is used to point to the appropriate entry in the circular buffers to ensure a proper interleave/de-interleave process. With such a method and apparatus, data interleaving and de-interleaving can be accomplished with less memory than is required by prior-art techniques.

FIG. 1 illustrates an example data stream 610 which is made up of a plurality of codewords 640–643. In the data stream 610, the size of the codeword, N, is equal to 7. The data stream 610 can be interleaved to a depth, D, equal to 3 to produce interleaved data stream 620. The delays between the receipt of the bytes in the data stream 610 and where they are output from the interleaver in the interleaved data stream 620 are based on the delay formula (D−1)*i where i is the index of the data byte in the data stream 610. It can be seen that data byte a0 (where 0 is the index) is delayed by 0 bytes, whereas byte a6 (where 6 is the index) is delayed by 12 bytes.

When data with one index is arriving in the data stream 610, data with another index is being output as part of the interleaved data stream 620. The relationship between the incoming index and the outgoing index is fixed (i.e. when the incoming data has index 1, the outgoing data has index 5, when the incoming data has index 2, the outgoing data has index 3, etc.). Likewise, during the de-interleave process, the relationship between the incoming index of the interleaved data stream 620 and the index of the outgoing de-interleaved data 630 is fixed. By making use of circular buffers, or First-In-First-Out buffers (FIFOs), to store the data for each particular index and taking advantage of the relationship between the incoming index and the outgoing index, the interleaving scheme can be achieved while minimizing the memory required.

FIG. 2 illustrates a flow diagram of method for interleave/de-interleave addressing which can be used in conjunction with a set of FIFOs to achieve either an interleave or a de-interleave function. At step 100, an array index for a first memory operation is obtained. The array index for the first memory operation is the index that describes the location of the data byte in its corresponding codeword of the incoming data stream. For the example illustrated in FIG. 1, the array indexes range from 0 to 6. In a data interleaving system, the first memory operation would be a write operation where the incoming data to be interleaved will be stored in the FIFO corresponding to its array index. In a data de-interleaving system the first memory operation would correspond to a read operation from a similar FIFO.

At step 102, the array index is used to retrieve an address from an address array for the first memory operation. The address array contains an address for each index. For the example illustrated in FIG. 1, 7 circular buffers, or FIFOs, corresponding to indexes 0–6 are used to store the data. In a more complex interleaving system, such as one used in an ADSL system having 255 indexes in each codeword, 255 FIFOs would be used. At this point, the incoming data may be written to the FIFO corresponding to its array index in the location designated by the address retrieved from the address array.

Figure 3:
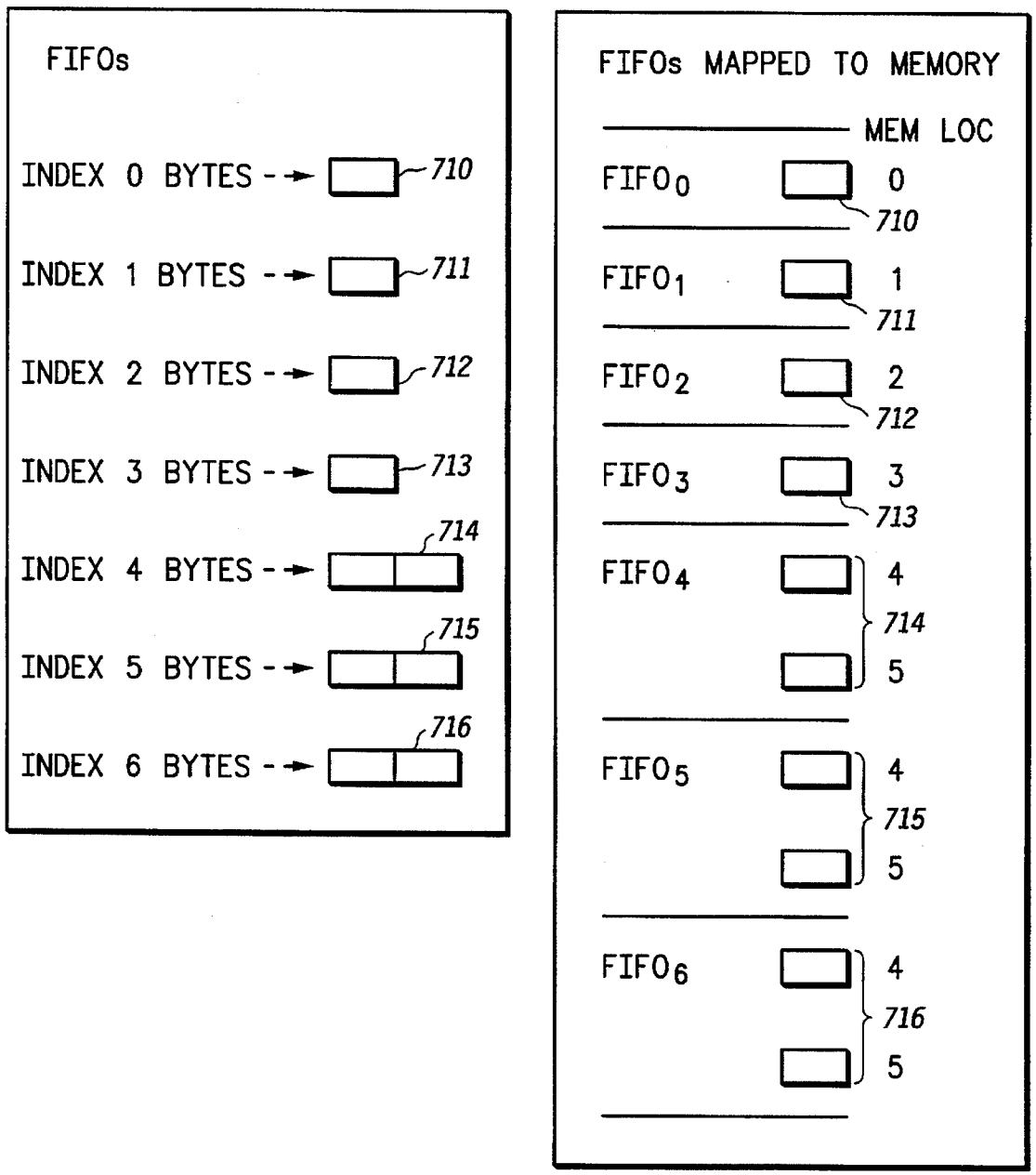
FIG. 3 illustrates circular buffers corresponding to the interleaving example of FIG. 1, where the circular buffers are in accordance with the present invention.

At step 104, array address boundaries are calculated based on the array index. The array address boundaries indicate where in memory the data corresponding to the current array index is being stored. In other words, the array address boundaries indicate where in memory the start and end of the FIFO corresponding to the current array index are located. Recall that the delay for a particular index is equal to (D−1)*i, where D is the depth of interleaving and i is the index. In an interleaving system, data with larger indexes will have to be delayed for longer periods of time, and the number of memory bytes in a FIFO corresponding to a particular index will vary. The inverse is true in a de-interleaving system where smaller indexes require more memory. In the interleaving example illustrated in FIG. 1, data with indexes 0–3 will be read out as interleaved data before the next incoming data with the same index will arrive. Therefore, only a single byte is needed in the FIFOs for these indexes. This is illustrated in FIG. 3, where memory bytes 710–713 correspond to the memory required for the FIFOs for indexes 0–3, respectively. However, indexes 4–6 will have a second data byte with the same index arrive before the last one written to the FIFO is read out. Therefore, these indexes will require two bytes of storage in their FIFOs, where the memory bytes 714–716 correspond to indexes 4–6, respectively. This is also shown in FIG. 3 where the memory bytes for all of the required FIFOs can be stored sequentially in memory. For more complex interleaving systems, the size of the FIFOs for each index is calculated based on the formula:

$$(\text{Size of FIFO})_i = 1 + \text{int}(((D-1)*i)/N) \quad (1)$$

where i represents the particular index value, int represents an integer function, N is the number of bytes in each codeword, and D is the depth of interleaving.

At step 106, the address retrieved from the address array is incremented to produce an incremented address. The incremented address is compared to array address boundaries at step 108. The comparison determines if the incremented address lies within the boundaries of the FIFO corresponding to the array index. The comparison is deemed to be favorable if the incremented address is within the FIFO boundaries (array address boundaries) and unfavorable if the incremented address goes beyond these boundaries.

If the incremented address is within the array address boundaries (the comparison is favorable), the incremented address is stored into the address array, at step 112, to produce a stored address. By doing this, a subsequent write operation (in the case of an interleaver) will retrieve an address corresponding to a subsequent location in the FIFO. If the incremented address is not within the array address boundaries (the comparison is unfavorable), one of the address array boundaries is stored into the address array, at step 110, to produce the stored address. In other words, if the incremented address goes beyond the boundaries of the FIFO, the address stored in the address array is reset to the beginning of the FIFO. Note that the incremented address for indexes 0–3 of FIG. 3 will always exceed the array boundaries, and thus the address of the only memory location in these FIFOs will always be written back into the address array.

In step 114, the array index that was used for the first operation is calculated for a second memory operation. A number of memory operations may occur between the time when the first operation takes place and when the array index is calculated for the second operation. In the example illustrated in FIG. 1, if the array index is 0, there will be no other operations between the first (write) operation and the second (read) operation. If the array index is 1 in the example, two read operations and two write operations of data having other indexes will occur between the write of data having index 1 and the read of the data having index 1. The calculation of the array index for the second operation is based on the interleaving/de-interleaving scheme. By analyzing the delays incurred by each index in the system, the equation:

$$P_i = (P_{i-1} + P_1) \bmod N \quad (2)$$

can be solved for $P_i$, where $P_i$ represents the index of the second operation when the index of the first operation is equal to i. Therefore, $P_1$ is the index used for the second operation when the first operation uses an index of 1 (i=1). $P_1$ can be found with the equation:

$$[(D-1)*P_i + P_1] \bmod N = i \quad (3)$$

where $(D-1)^*P_i$ is equal to the delay of the byte with index $P_i$. When the index $P_i$ is added to the delay of the byte with index $P_i$ and the modulus calculation is used to account for the repetition of indexes, i can be calculated. For i=1, the equation becomes:

$$[(D-1)^*P_1 + P_1] \bmod N = 1 \qquad (4)$$

which reduces to:

$$[D^*P_1] \bmod N = 1 \qquad (5)$$

Once EQ. 5 has been solved to determine $P_1$, $P_i$ becomes a simple calculation for any i using EQ. 2.

In an interleaving system, the calculation of EQ. 2 will determine which data byte is to be read from memory as the next data byte in the interleaved data stream. In a de-interleaving system the calculation of EQ. 2 will determine where the next data byte of an incoming interleaved data stream will be written in memory.

In step 116, the array index is utilized to retrieve the stored address from the address array based on the second memory operation. The stored address is then used in the second memory operation, which will be a read in an interleaving system and a write in a de-interleaving system. At step 118, the array index is incremented to produce an incremented array index, where the incrementing is done in a modulo N fashion. The steps beginning at step 100 can then be repeated using the incremented array index.

Using the method of FIG. 2, the memory required to implement an interleaving scheme is approximately equal to the memory required to implement the FIFOs for the different indexes, which approaches $(N^*D)/2$. Thus the amount of memory required for interleaving/de-interleaving using this method is approximately half that of the prior art technique.

Figure 4:
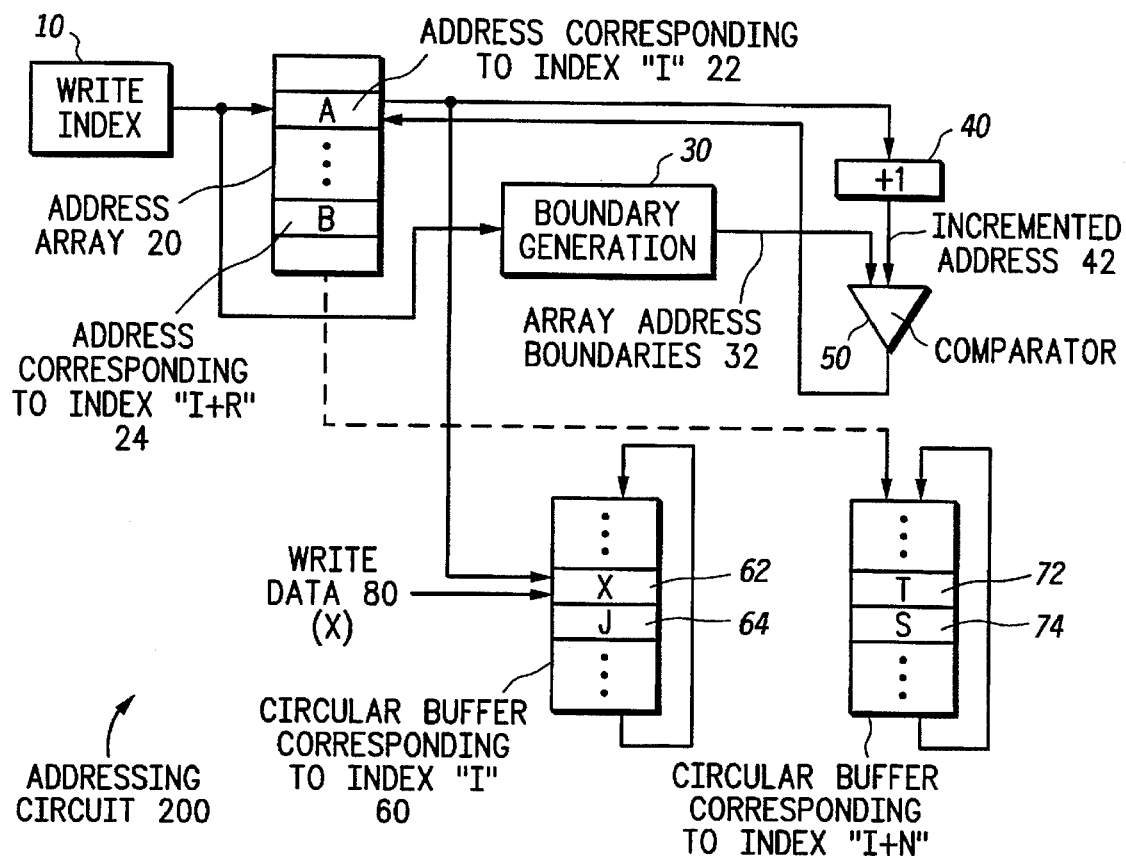
FIG. 4 illustrates, in a block diagram, a first time-slice view of a data interleave/de-interleave system in accordance with the present invention.

FIGS. 4-7 can be used to illustrate the method of FIG. 2 used in a more complex interleaving system. FIG. 4 illustrates a first time-slice of an interleaving addressing circuit 200 employing the method of FIG. 2, where the addressing circuit 200 includes an address array 20, an incrementor 40, a boundary generation block 30, a comparator 50, and circular buffers 60, 70. At the time corresponding to the time slice illustrated, the first memory operation, which is a write operation in the interleaving circuit, is taking place. The write index 10 corresponds to the index "I" of the write data 80 (in this example the write data 80 is equal to the value X). The write index is used to retrieve the address corresponding to the index "I" 22 from the address array 20. The address 22 is used to address the circular buffer 60 that corresponds to index "I". In the illustration, the address 22 addresses location 62 which is overwritten with the write data 80. Because the data written in location 62 is the most recent addition to the circular buffer 60, it should be the last data currently in the circular buffer 60 to be read. It should also be apparent that the data in location 64 (shown to have the value J) is the oldest data currently in the circular buffer 60, and thus should be the next data to be read. The next operation using the index "I" will be a read operation, and therefore the address corresponding to address "I" is incremented in a modulo fashion such that the read operation will retrieve the address corresponding to location 64 of the circular buffer 60.

While writing the data 80 into circular buffer 60, the address array 20 is concurrently being updated. To this end, the address 22 is incremented by an incrementor 40 to produce an incremented address 42. The boundary generation block 30 calculates array address boundaries 32 for the write index 10, i.e. the memory addresses that correspond to the limits of the circular buffer corresponding to the write index 10. (Recall EQ. 1 provides the computation necessary to determine the number of entries in a FIFO.) The incremented address 42 is compared with the array address boundaries 32 by the comparator 50. If the incremented address 42 lies within the array address boundaries 32, the comparator 50 outputs the incremented address 42. If the incremented address 42 exceeds the array address boundaries 32, the comparator 50 outputs one of the array address boundaries 32 (i.e. it resets the circular buffer to the beginning). Thus, the comparator 50 in conjunction with the incrementor 40 and the boundary generation block 30 achieves a modulo increment function acting upon the address 22. The output of the comparator 50 is written back to the address array 20 such that the subsequent read operation using index "I" will read from the location containing the oldest data in the circular buffer 60.

Figure 5:
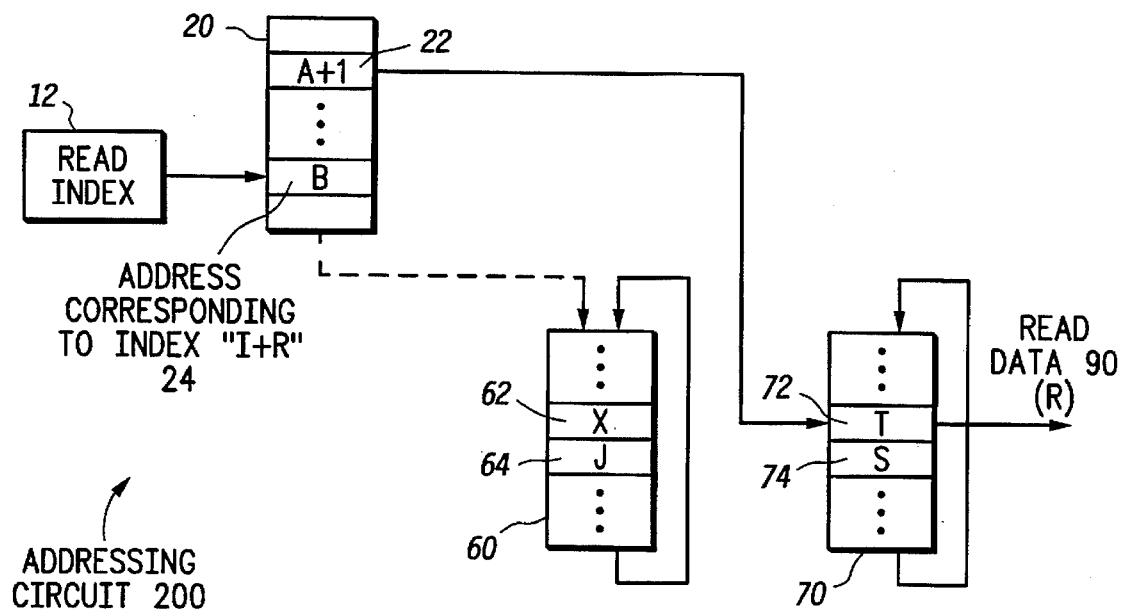
FIG. 5 illustrates, in a block diagram, a second time-slice view of a data interleave/de-interleave system in accordance with the present invention.

FIG. 5 illustrates a subsequent time-slice of the addressing circuit 200. At the time corresponding to the time slice depicted, a second memory operation, which is a read operation in the interleaving system, is occurring. The read operation illustrated may be a read operation that occurs immediately following the write operation that was illustrated in FIG. 4 or several operations later. The read index 12 is calculated based on the interleaving pattern as described above and is used to retrieve the address corresponding to the index "I+R" 24. The address 24 (B) points to location 72 in the circular buffer 70, where the circular buffer 70 corresponds to the index "I+R". It should be apparent that the last location written in the circular buffer 70 is the location directly preceding location 72. The data at location 72, which is the oldest data in the circular buffer 70, is read to produce read data 90.

It should be noted that in the description the direction of traverse in terms of data reading and writing to the FIFO is assumed to be in the direction of increasing address values. Note that this could easily be reversed without affecting the functionality of the system. In such a case, the address values addressing the FIFOs would be decremented (incremented negatively) prior to the next operation rather than incremented.

Figure 6:
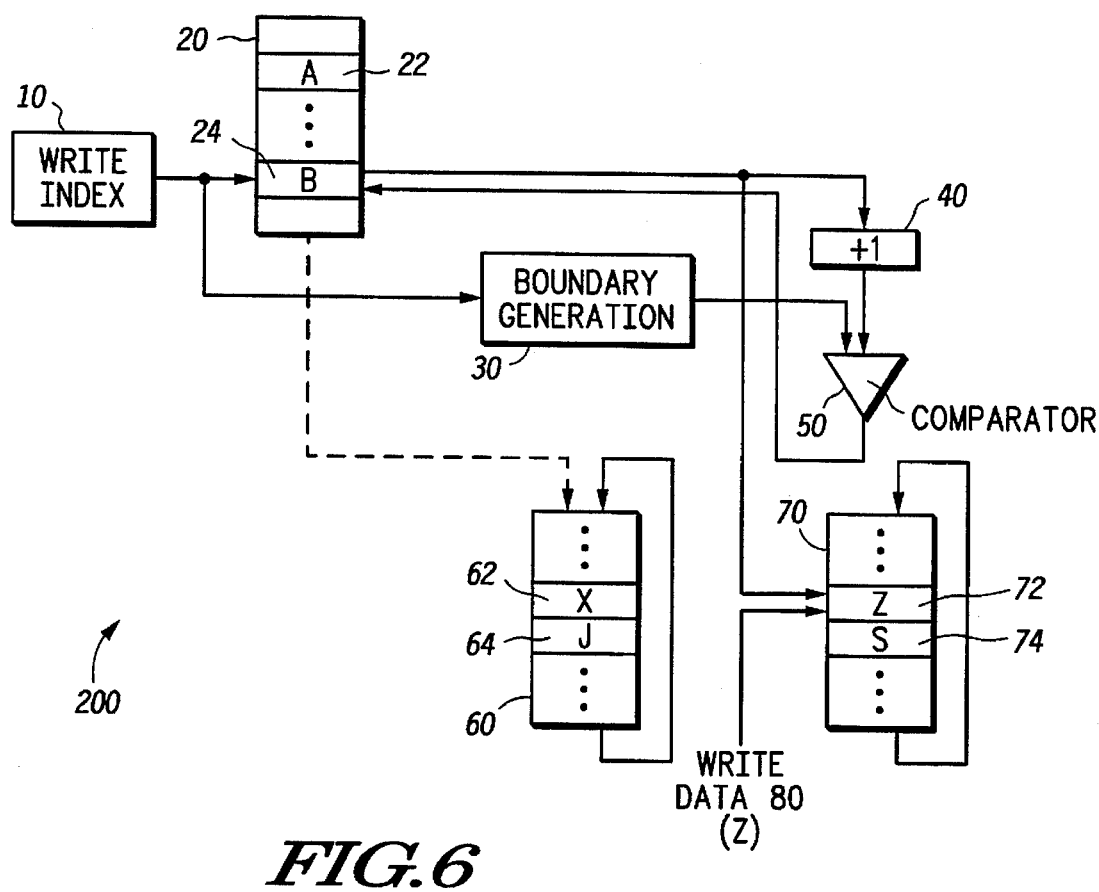
FIG. 6 illustrates, in a block diagram, a third time-slice view of a data interleave/de-interleave system in accordance with the present invention.

FIG. 6 illustrates a subsequent write operation, where the write index 10 is equal to the read index 12 used in FIG. 5. The write index 10 retrieves address 24 (B) from the address array 20. Note that address 24 still corresponds to the same location in circular buffer 70 which was read in the previous read operation. The new write data 80, which has the value Z, is written over the previously read value at location 72 and the address 24 is updated to point to the subsequent address 74 of circular buffer 70.

Figure 7:
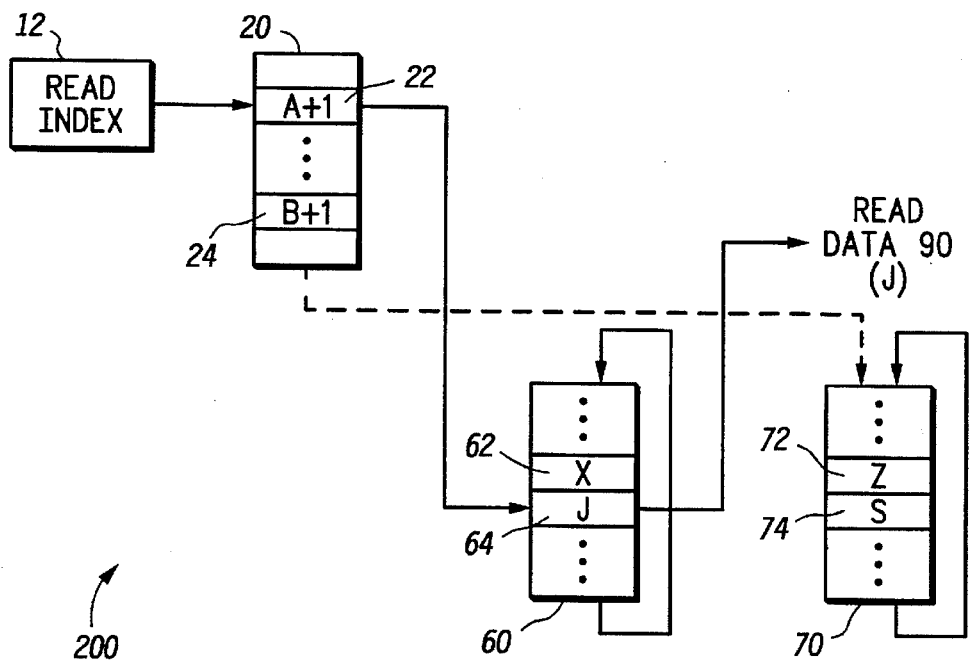
FIG. 7 illustrates, in a block diagram, a fourth time-slice view of a dam interleave/de-interleave system in accordance with the present invention.

FIG. 7 illustrates a subsequent read operation, where the read index 12 is equal to the write index 10 of FIG. 4. The read index 12 retrieves address 22 (A+1) from address array 20, where the address 22 points to location 64 of circular buffer 60. Note that because the data at location 62 was written in the most recent write operation using index "I", the oldest data in the circular buffer 60 is at location 64. The data at location 64 is then read to produce read data 90.

Thus, for each byte of data received in the data stream in an interleaving system, a write operation and a read operation are performed. The write operation occurs first and updates the address in the address array of the index used for the write operation. By doing this, the data that was most recently read out is overwritten, and the address in the array is set to point to the next data to be read. The read operation uses the incremented address in the array and does not update it after its operation is complete, thus leaving things set up for the write operation to overwrite the data which has already been read out. Using this system, the circular buffers, or FIFOs, for each index are constantly full of data and no memory is wasted waiting for particular codewords to become complete.

It should be obvious to one skilled in the art that incrementing the address after writing to a location could easily be replaced with incrementing the address before reading from a location, which would achieve the same effect.

Figures 8, 9:
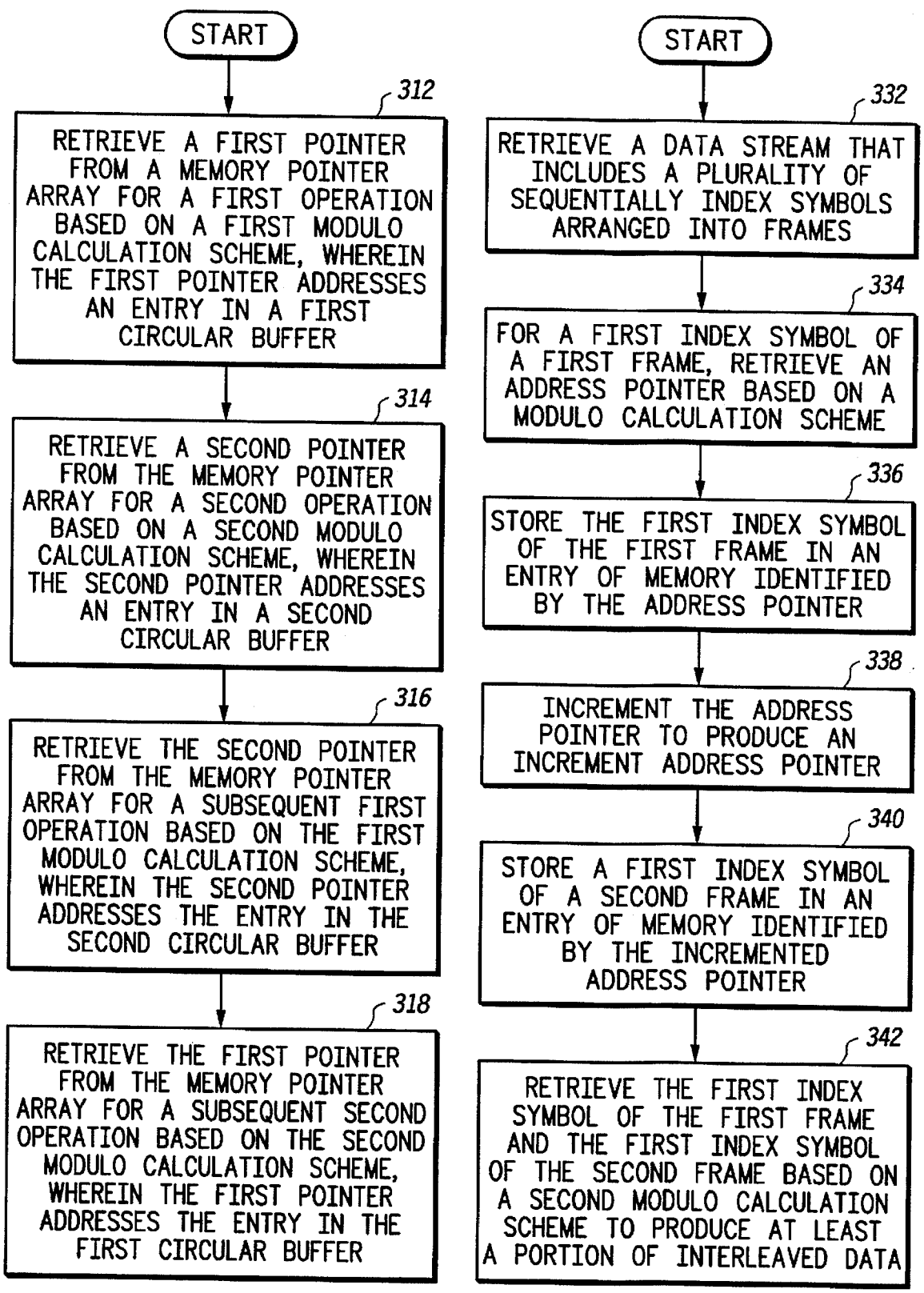
FIG. 8 illustrates, in a flow diagram, a method for interleave/de-interleave addressing in accordance with the present invention.
FIG. 9 illustrates, in a flow diagram, a method for interleaving data in accordance with the present invention.

FIG. 8 illustrates an alternate method for interleave/de-interleave addressing. At step 312, a first pointer is retrieved from a memory pointer array for a first operation based on a first modulo calculation scheme, where the first pointer addresses an entry in a first circular buffer. In an interleave operation, the first operation would be a write operation, and the first modulo calculation scheme would be a modulo increment. By using a modulo increment to determine the index used to retrieve the first pointer from the memory pointer array, where the memory pointer array is similar to the address array described earlier, the indexes of the data in the incoming data stream will be accurately tracked as they will repeat with the start of each codeword.

In step 314, a second pointer is retrieved from the memory pointer array for a second operation based on a second modulo calculation scheme, where the second pointer addresses an entry in a second circular buffer. As was described above, in an interleave system, the index used for the second (read) operation is based on the index of the most recent first (write) operation. Once a read index for a particular write index is established, a modulo addition scheme may be used to calculate subsequent read indexes based on the previous read index. In this case, a fixed addend, which is based on the interleave pattern, is supplied to a modulo addition block along with the previous index to calculate the subsequent index to the memory pointer array.

In step 316, the second pointer is retrieved from the memory pointer array for a subsequent first operation based on the first modulo calculation scheme, where the second pointer addresses the entry in the second circular buffer. In an interleaving system, this corresponds to the write index being incremented in a modulo fashion after each write and eventually being equal to the index used for the read operation of step 314. Write data is then used to overwrite the data in the second circular buffer that was read in step 314.

In step 318, the first pointer is retrieved from the memory pointer array for a subsequent second operation based on the second modulo calculation scheme, where the first pointer addresses the entry in the first circular buffer. In an interleaving system, this corresponds to a read index being calculated via the second modulo calculation scheme that matches the index used in the write operation of step 312. Assuming that enough iterations of the steps have occurred that the pointer to the first circular buffer now points to the same location used in step 312, the data that was written at that location will be read out as interleaved data. Note that all of the other entries in the first circular buffer at the time step 312 occurred will be read out before the read operation reads the data that was written at step 312.

Although the above description of FIG. 8 concerns itself mainly with data interleaving, the same method can be employed to de-interleave data. In the de-interleaving case, the first operation would correspond to a read operation and the second operation would correspond to a write operation.

FIG. 9 illustrates an alternate method for interleaving data. In step 332, a data stream is received, where the data stream includes a plurality of sequentially indexed symbols arranged into frames, or codewords. At step 334, an address pointer is retrieved for a first index symbol of a first frame based on a first modulo calculation scheme. The first modulo calculation scheme could be a modulo increment scheme such that successive indexes retrieve successive address pointers. The address pointer is retrieved from an address array which was detailed in the description of FIGS. 4–7.

In step 336, the first index symbol of the first frame is stored in an entry of memory identified by the address pointer. This would correspond to writing the data to an entry of a circular buffer, where the specific entry location is determined by the address pointer and the circular buffer corresponds to the first index. The address pointer is incremented, at step 338, to produce an incremented address pointer, where the incremented address pointer is calculated in a modulo fashion based on the size of the circular buffer for the first index. The incremented address pointer is stored back in the address array.

At step 340, a first index symbol of a second frame is stored in an entry of memory identified by the incremented address pointer. Note that the first index symbol of the second frame has the same index as the first index symbol of the first frame, and, therefore, is stored in the same circular buffer. The incremented address pointer will identify the entry of memory subsequent to the entry used to store the first index symbol of the first frame, and the first index symbol of the second frame is stored in that entry. At step 342, the first index symbol of the first frame and the first index symbol of the second frame are retrieved based on a second modulo calculation to produce at least a portion of interleaved data. In other words, the two sequentially stored symbols are retrieved based on a second modulo calculation scheme to produce a portion of the interleaved data.

Figure 10:
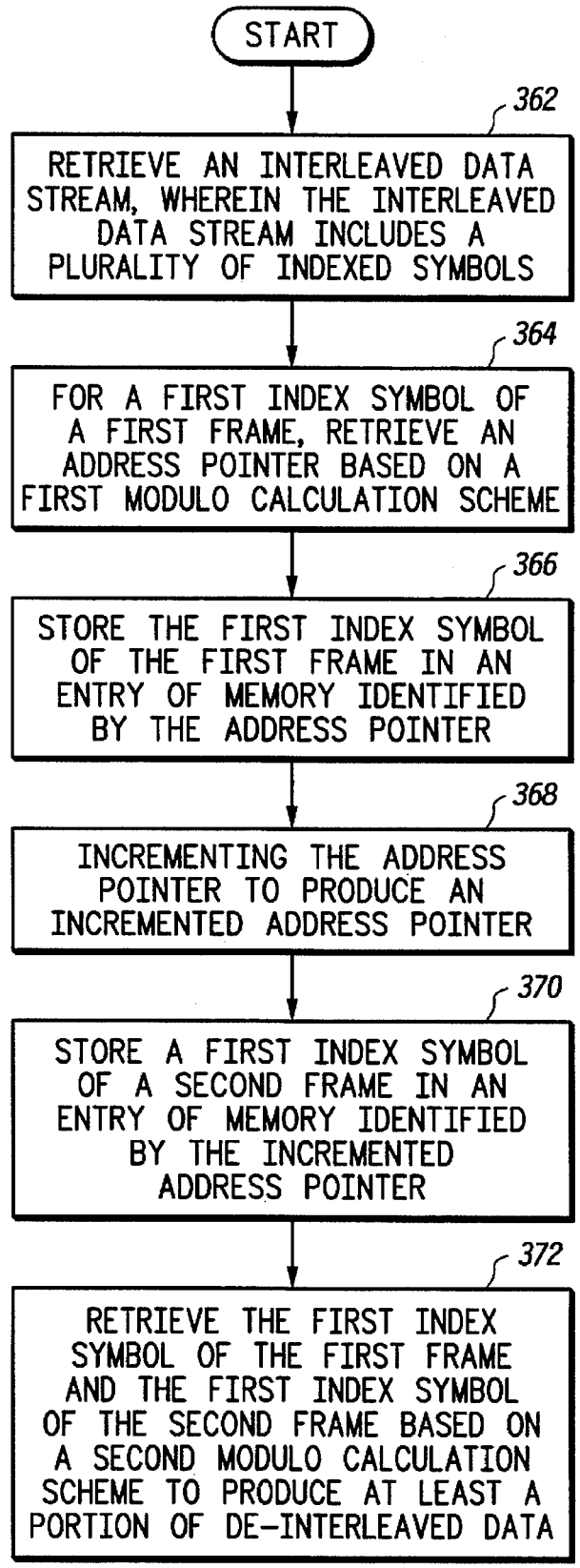
FIG. 10 illustrates, in a flow diagram, a method for de-interleaving data in accordance with the present invention.

A method for de-interleaving data is illustrated in FIG. 10. In step 362, an interleaved data stream is received, where the interleaved data stream includes a plurality of indexed symbols. An address pointer is retrieved at step 364 for a first index symbol of a first frame based on a first modulo calculation scheme. The address pointer may be retrieved from an address array similar to that illustrated in FIGS. 4–7. Because the data is arriving in an interleaved format, the first modulo calculation scheme should be such that it produces indexes that match those associated with the arriving symbols (i.e. if symbols arrive in the index order 0,5,3,1,6,4,2, the first modulo calculation scheme will produce the same sequence).

In step 366, the first index symbol of the first frame is stored in an entry of memory identified by the address pointer. The entry of memory is a location in a circular buffer, where the circular buffer corresponds to the first index. At step 368, the address pointer is incremented to produce an incremented address pointer, where the incremented address pointer is stored in the address array. In step 370, a first index symbol of a second frame is stored in an entry of memory identified by the incremented address pointer, which may be a subsequent location to that used to store the first index symbol of the first frame in step 366. At step 372, the first index symbol of the first frame and the first index symbol of the second frame are retrieved based on a second modulo calculation scheme to produce at least a portion of de-interleaved data. In this de-interleaver, the second modulo calculation scheme may be a modulo increment scheme, where data is read from sequentially indexed circular buffers, or FIFOs, to produce the de-interleaved data stream.

Figure 11:
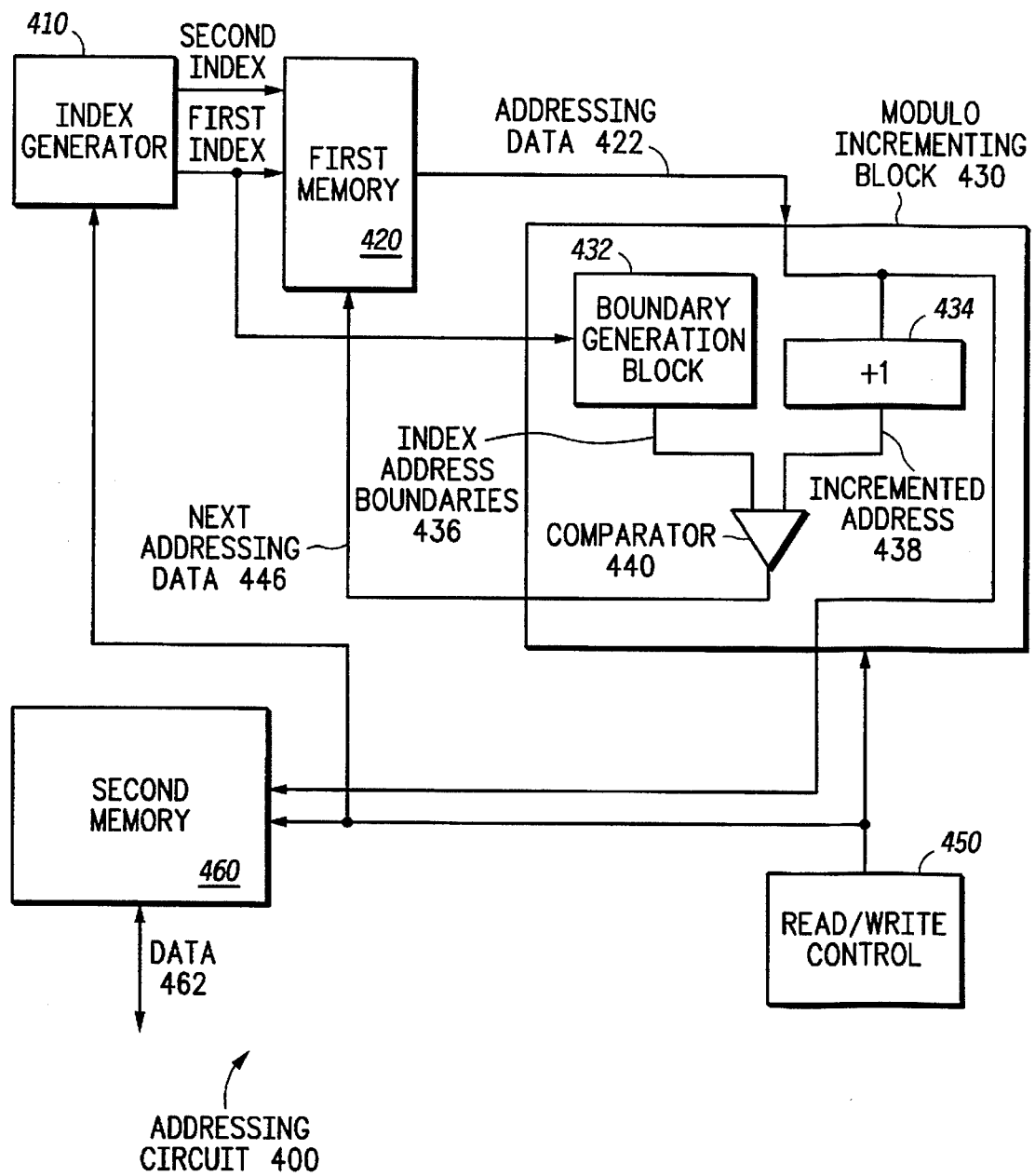
FIG. 11 illustrates, in a block diagram, an interleave/de-interleave addressing circuit in accordance with the present invention.

FIG. 11 illustrates an interleave/de-interleave addressing circuit 400 which includes an index generator 410, first memory 420, modulo incrementing block 430, read/write control block 450, and second memory 460. The index generator 410, which may be an address generation unit (AGU), generates a first index 414 based on a first indexing pattern for a write operation and generates a second index 412 based on a second indexing pattern for a read operation. The first indexing pattern may be a modulo incrementing pattern, and the second indexing pattern may be a modulo addition pattern with a fixed addend, where the fixed addend is based on an interleave pattern.

The first memory 420, which may be random access memory (RAM), is addressed by either the first index 414 or the second index 412 to retrieve addressing data 422 for the write operation or the read operation, respectively. The addressing data 422 is arranged such that each index corresponds to a location in the first memory 420. The addressing data 422 is used in the second memory 460, which may be random access memory (RAM), to address one of a plurality of circular buffers that make up at least a portion of the second memory 460. Each of the plurality of circular buffers corresponds to one of the index values. During a read operation, the second memory 460 reads data 462 from the location specified by the addressing data 422 in the circular buffer corresponding to the second index 412. During a write operation, the second memory 460 writes data 462 to the location specified by the addressing data 422 in the circular buffer corresponding to the first index 414.

The modulo incrementing block 430, which may be a counter, receives the addressing data 422 and increments it in a modulo fashion to produce next addressing data 446 for the write operation. This modulo increment can be accomplished by incrementing the addressing data 422 in the incrementor 434 to produce an incremented address 438. Concurrently, the boundary generation block 432 receives the first index 414 and generates index address boundaries 436 based on the first index 414. The incremented address 438 is then compared with the index address boundaries 436 in the comparator 440 to produce a comparison result. The comparator outputs either the incremented address 438 or one of the index address boundaries 436 based on the comparison result to produce the next addressing data 446.

For a write operation, the modulo incrementing block 430 provides the next addressing data 446 to the first memory 420 such that the first memory 420 overwrites the addressing data 422 with the next addressing data 446 at the location addressed by the first index 414.

The read/write control block 450 selects the read operation or the write operation in the circuit, and issues control signals to the appropriate blocks to ensure that the correct operation occurs.

Figure 12:
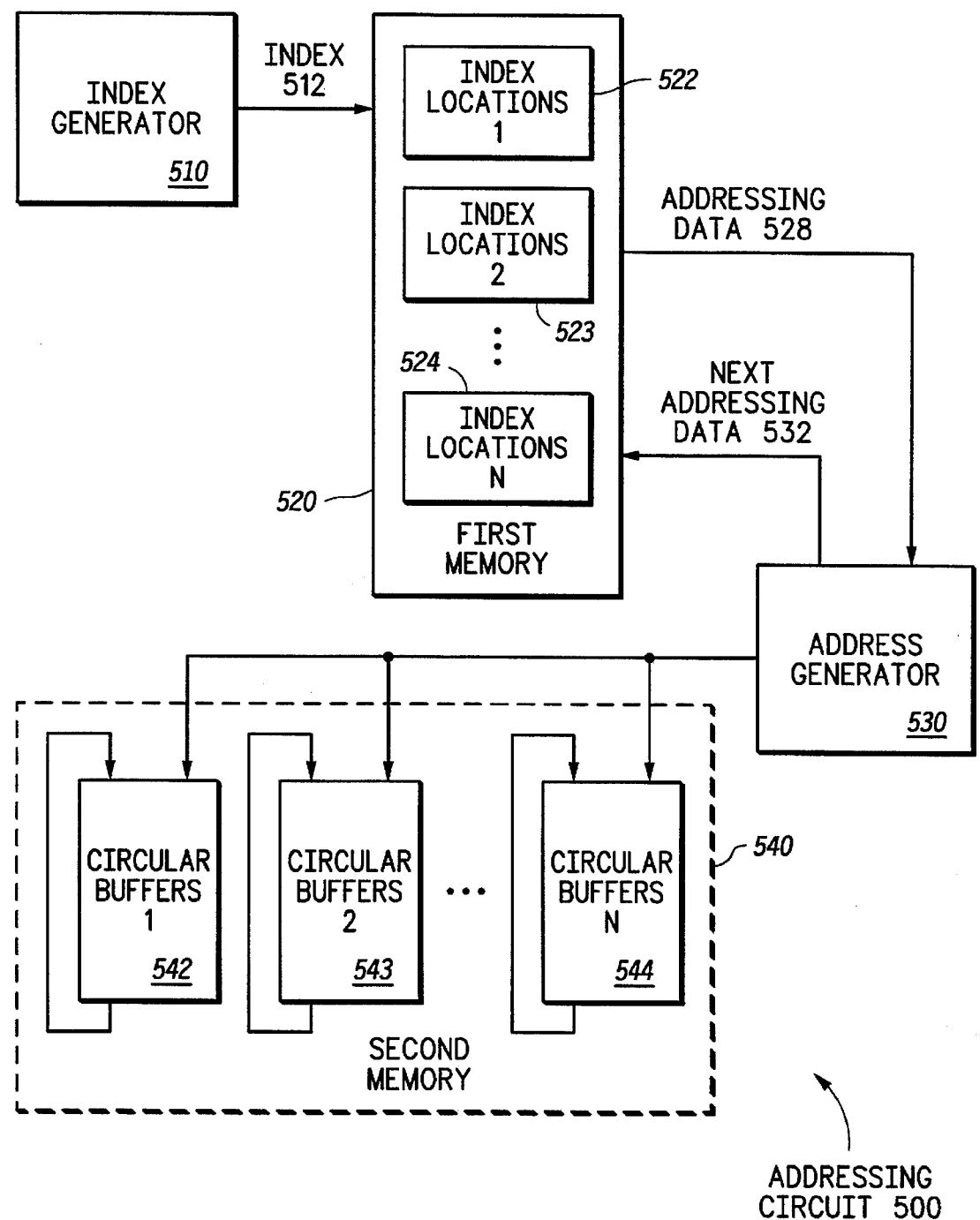
FIG. 12 illustrates, in a block diagram, an interleave/de-interleave addressing circuit in accordance with the present invention.

FIG. 12 illustrates an alternate interleave/de-interleave addressing circuit 500 which includes an index generator 510, a first memory 520, an address generator 530, and a second memory 540. The index generator 510 generates a plurality of indexes based on a first indexing pattern for a first operation and generates the plurality of indexes based on a second indexing pattern for a second operation. The first indexing pattern may be a modulo incrementing pattern, and the second indexing pattern may be a modulo addition pattern with a fixed addend, where the fixed addend is based on an interleave pattern. The plurality of indexes correspond to a number of index locations 522–524 of data being stored and subsequently read, where the index locations 522–524 are part of the first memory 520. When one of the index locations 522–524 is addressed by an index 512, the first memory 520 provides addressing data 528.

The second memory 540 includes a plurality of circular buffers 542–544 which correspond to the index locations 522–524. The address generator 530 addresses an entry in one of the plurality of circular buffers based on the addressing data 528 for the first operation or the second operation. The address generator 530 also generates next addressing data 532 based on the addressing data 528 in a similar manner as the modulo incrementing block 430 of FIG. 11, and the first memory overwrites the addressing data 528 with the next addressing data 532 subsequent to the first operation.

In an interleaving system, the first operation will be a write operation, where the index 512 retrieves addressing data 528 which indicates where in one of the circular buffers to place the data to be interleaved. The address generator 530 then increments the addressing data 528 in a modulo fashion such that the pointer to that particular circular buffer points to the next data to be read. The second operation in such an interleaving system is a read operation, where the index 512 is used to retrieve addressing data 528 that indicates the particular location in the circular buffer corresponding to the index 512 from which to read the next piece of interleaved data. The first and second operations are reversed for a data de-interleaving system.

The present invention provides a method and apparatus for interleave/de-interleave addressing in data communication circuits. By storing the data to be interleaved/de-interleaved in FIFOs of the correct size and providing a method and apparatus for addressing the FIFOs, the interleave and de-interleave functions can be accomplished using approximately one-half of the memory required by prior-art techniques, which reduces die area and cost.

We claim:

1. A method for interleave/de-interleave addressing comprising the steps of:

a) obtaining an array index for a first memory operation;

b) utilizing the array index to retrieve an address from an address array for the first memory operation;

c) calculating array address boundaries based on the array index;

d) incrementing the address to produce an incremented address;

e) comparing the incremented address to the array address boundaries;

f) storing the incremented address into the address array to produce a stored address when the incremented address compares favorably to the array address boundaries;

g) storing one of the array address boundaries into the address array to produce the stored address when the incremented address compares unfavorably to the array address boundaries;

h) calculating the array index for a second memory operation; and i) utilizing the array index to retrieve the stored address from the address array based on the second memory operation.

2. The method of claim 1 further comprises performing the first memory operation as a write operation and performing the second memory operation as a read operation, wherein the write operation and the read operation are part of a data interleaving scheme.

3. The method of claim 1 further comprises performing the first memory operation as a read operation and performing the second memory operation as a write operation, wherein the read operation and the write operation are part of a data de-interleaving scheme.

4. The method of claim 1 further comprises:

j) incrementing the array index to produce an incremented array index.

5. The method of claim 4 further comprises:

k) utilizing the incremented array index to retrieve a subsequent address from the address array for a subsequent first memory operation;

l) calculating subsequent array address boundaries based on the incremented array index;

m) incrementing the subsequent address to produce a subsequent incremented address;

n) comparing the subsequent incremented address to the subsequent array address boundaries;

o) storing the subsequent incremented address into the address array to produce a subsequent stored address when the subsequent incremented address compares favorably to the subsequent array address boundaries;

p) storing one of the subsequent array address boundaries into the address array to produce the subsequent stored address when the subsequent incremented address compares unfavorably to the subsequent array address boundaries;

q) calculating the incremented array index for a subsequent second memory operation; and r) utilizing the incremented array index to retrieve the subsequent stored address from the address array based on the subsequent second memory operation.

6. An interleave/de-interleave addressing circuit comprising:

an index generator that generates a first index based on a first indexing pattern for a write operation and generates a second index based on a second indexing pattern for a read operation;

first memory operably coupled to the index generator, wherein the first memory is addressed by either the first index or the second index to retrieve addressing data for the write operation or the read operation, respectively;

a modulo incrementing block operably coupled to the first memory, wherein the modulo incrementing block receives the addressing data, increments the addressing data in a modulo fashion to produce next addressing data for the write operation, and wherein for a write operation the modulo incrementing block provides the next addressing data to the first memory such that the first memory overwrites the addressing data with the next addressing data at a location addressed by the first index; and second memory that writes data during the write operation and reads data during the read operation, wherein the second memory is addressed by the addressing data.

7. The interleave/de-interleave addressing circuit of claim 6 further comprises a read/write control block operably coupled to the modulo incrementing block, the index generator, and the second memory, wherein the read/write control block selects the read operation or the write operation.

8. The interleave/de-interleave addressing circuit of claim 6, wherein the modulo incrementing block further comprises:

an incrementor, wherein the incrementor increments the addressing data to produce an incremented address;

a boundary generation block which generates index address boundaries based on the first index; and a comparator operably coupled to the incrementor and the boundary generation block, wherein the comparator compares the incremented address to the index address boundaries to produce a comparison result, and wherein the comparator outputs either the incremented address or one of the index address boundaries based on the comparison result to produce the next addressing data.

9. The interleave/de-interleave addressing circuit of claim 6, wherein the first indexing pattern further comprises a modulo incrementing pattern.

10. The interleave/de-interleave addressing circuit of claim 6, wherein the second indexing pattern further comprises a modulo addition pattern with a fixed addend, wherein the fixed addend is based on an interleave pattern.

11. The interleave/de-interleave addressing circuit of claim 6, wherein the second memory further comprises a plurality of circular buffers, wherein the first index corresponds to a first one of the plurality of circular buffers and the second index corresponds to a second one of the plurality of circular buffers.

12. An interleave/de-interleave addressing circuit comprising:

an index generator that generates a plurality of indexes based on a first indexing pattern for a first operation and generates the plurality of indexes based on a second indexing pattern for a second operation, wherein the plurality of indexes correspond to a number of index locations of data being stored and subsequently read;

first memory operably coupled to the index generator, wherein the first memory provides addressing data when addressed by one of the plurality of indexes;

a plurality of circular buffers corresponding to the number of index locations; and address generator operably coupled to the plurality of circular buffers and the first memory, wherein the address generator generates next addressing data based on the addressing data, wherein the address generator addresses an entry in one of the plurality of circular buffers based on the addressing data, and wherein the first memory overwrites the addressing data with the next addressing data subsequent to the first operation.

13. The interleave/de-interleave addressing circuit of claim 12, wherein the first indexing pattern further comprises a modulo incrementing pattern.

14. The interleave/de-interleave addressing circuit of claim 12, wherein the second indexing pattern further comprises a modulo addition pattern with a fixed addend, wherein the fixed addend is based on an interleave pattern.

15. The interleave/de-interleave addressing circuit of claim 12, wherein the address generator further comprises a modulo incrementing block that generates the next addressing data by incrementing the addressing data in a modulo fashion.

16. The interleave/de-interleave addressing circuit of claim 15, wherein the modulo incrementing block further comprises:

an incrementor, wherein the incrementor increments the addressing data to produce an incremented address;

a boundary generation block which generates index address boundaries based on the first index; and a comparator operably coupled to the incrementor and the boundary generation block, wherein the comparator compares the incremented address to the index address boundaries to produce a comparison result, and wherein the comparator outputs either the incremented address or one of the index address boundaries based on the comparison result to produce the next addressing data.

17. The interleave/de-interleave addressing circuit of claim 12, wherein the first operation is a write operation and the second operation is a read operation, and wherein the write operation and the read operation are part of a data interleaving scheme.

18. The interleave/de-interleave addressing circuit of claim 12, wherein the first operation is a read operation and the second operation is a write operation, and wherein the read operation and the write operation are part of a data de-interleaving scheme.

* * * * *